(12) United States Patent
Noguchi

(10) Patent No.: US 7,649,249 B2
(45) Date of Patent: Jan. 19, 2010

(54) SEMICONDUCTOR DEVICE, STACKED STRUCTURE, AND MANUFACTURING METHOD

(75) Inventor: Takashi Noguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 322 days.

(21) Appl. No.: 11/365,842

(22) Filed: Mar. 2, 2006

(65) Prior Publication Data

US 2006/0197181 A1    Sep. 7, 2006

(30) Foreign Application Priority Data

Mar. 3, 2005    (JP)    ............... 2005-059269

(51) Int. Cl.
*H01L 23/02*    (2006.01)
*H01L 23/52*    (2006.01)
(52) U.S. Cl. ................. 257/686; 257/696; 257/698; 257/758; 257/774; 257/777; 257/E23.021; 257/E23.064; 257/E23.085; 257/E23.145
(58) Field of Classification Search ............. 257/686, 257/696, 774, 777, 698, 758, E23.021, E23.067, 257/E23.085, E23.145, 707, 706
See application file for complete search history.

(56) References Cited

U.S. PATENT DOCUMENTS

| | | | |
|---|---|---|---|
| 6,087,719 A | | 7/2000 | Tsunashima |
| 6,784,530 B2 * | | 8/2004 | Sugaya et al. ............... 257/686 |
| 6,982,488 B2 * | | 1/2006 | Shin et al. .................... 257/777 |
| 7,122,891 B2 * | | 10/2006 | Dishongh et al. ........... 257/700 |
| 2002/0084524 A1 * | | 7/2002 | Roh et al. .................... 257/738 |
| 2005/0040509 A1 * | | 2/2005 | Kikuchi et al. .............. 257/686 |
| 2005/0110128 A1 * | | 5/2005 | Ahn et al. .................... 257/686 |
| 2005/0146008 A1 * | | 7/2005 | Miyamoto et al. .......... 257/686 |
| 2005/0200027 A1 * | | 9/2005 | Sinha et al. ................. 257/774 |

FOREIGN PATENT DOCUMENTS

JP    10-223833    8/1998

* cited by examiner

*Primary Examiner*—Kenneth A Parker
*Assistant Examiner*—Joseph Nguyen
(74) *Attorney, Agent, or Firm*—Volentine & Whitt, P.L.L.C.

(57) ABSTRACT

An array of electrically conductive members, formed around the edges of a semiconductor device or chip, penetrate from one major surface of the device to the other major surface. In an area located inward of this array, a multiplicity of thermally conductive members also penetrate from one major surface to the other major surface. The semiconductor device can be manufactured from a semiconductor wafer by creating holes that penetrate partway through the wafer, filling the holes with metal to form the electrically conductive members and thermally conductive members, and then grinding the lower surface of the wafer to expose the ends of the electrically conductive members and thermally conductive members before dicing the wafer into chips. The thermally conductive members improve heat dissipation performance when semiconductor chips of this type are combined into a stacked multichip package.

21 Claims, 7 Drawing Sheets

… (US 7,649,249 B2)

SEMICONDUCTOR DEVICE, STACKED STRUCTURE, AND MANUFACTURING METHOD

BACKGROUND OF THE INVENTION

1. Field of the Invention

The present invention relates to a semiconductor device and its manufacturing method, to a stacked structure including the semiconductor device, and to a package including the stacked structure.

2. Description of the Related Art

Multichip semiconductor devices in which a plurality of semiconductor chips are stacked in various ways are under development for the twin purposes of greater functionality and greater integration. One example is described in Japanese Patent Application Publication No. 10-223833, which discloses a semiconductor device comprising a stack of semiconductor integrated circuit chips interconnected by plugs and bumps.

In this structure, the heat generated by the integrated circuit chips is to some extent dissipated to the ambient environment through the interconnecting plugs, but this heat dissipation mechanism is inadequate. In particular, there is no path for dissipation of heat generated near the center of the multichip device. The device therefore has a tendency to overheat, particularly in its central regions.

When the stacked structure forms a stacked multichip package, as the temperature within the package rises, there is a risk of thermal damage to the circuit elements in the constituent integrated circuit chips, thermal distortion of the multichip package as a whole, and thermal distortion of its structural elements. High temperatures can also cause semiconductor circuits to operate incorrectly, even if they are not permanently distorted or damaged. The ultimate result is that stacked semiconductor devices and in particular stacked multichip packages are unreliable.

There is an urgent need for technology to improve the heat dissipation performance of stacked multichip packages, and for a simplified way to manufacture the semiconductor devices constituting the stack so as to have improved heat dissipation properties.

SUMMARY OF THE INVENTION

An object of the present invention is to improve the heat dissipation properties of a stacked multichip package.

Another object of the invention is to provide a semiconductor device that, when incorporated into a stacked multichip package, provides improved heat dissipation.

Another object of the invention is to provide a simplified way to fabricate such a semiconductor device.

The invention provides a semiconductor device having two major surfaces with respective edges. A plurality of electrically conductive members extend from the first major surface to the second major surface in an array disposed at the edges of the major surfaces. A plurality of thermally conductive members extend from the first major surface to the second major surface in an area preferably inward of the array of electrically conductive members.

When semiconductor devices of the invented type are incorporated into a stacked multichip package, the thermally conductive members improve the cooling efficiency of the package, especially in the central regions of the package. Heat that would otherwise build up inside the package is conducted by the thermally conductive members to the surface of the package and dissipated to the ambient environment. The semiconductor devices and the microelectronic circuits therein are thereby protected from thermal distortion, damage, and destruction and the reliability of the multichip package is markedly improved.

The semiconductor devices can moreover be fabricated in an extremely simple way by a semiconductor device fabrication method comprising:

providing a matrix of chip areas in a semiconductor wafer having an upper surface and a lower surface and forming circuits in the chip areas;

forming a dielectric film on the upper surface of the semiconductor wafer;

forming a plurality of holes, including electrical interconnection holes and heat dissipation holes, in the chip areas of the semiconductor wafer, the holes penetrating only partway through the semiconductor wafer;

forming a conductive film on the dielectric film, the conductive film filling the holes;

removing the conductive film until the dielectric film is exposed, leaving electrically conductive members filling the electrical interconnection holes and thermally conductive members filling the heat dissipation holes;

grinding the lower surface of the semiconductor wafer until respective ends of the electrically conductive members and the thermally conductive members are exposed; and dicing the semiconductor wafer to separate the chip areas from each other and form a plurality of semiconductor devices.

The above semiconductor device fabrication method may further comprise forming trenches connecting at least some of the electrical interconnection holes with at least some of the heat dissipation holes, after forming the holes, in which case:

forming the conductive film includes filling the trenches; and removing the conductive film includes leaving thermally conductive wires filling the trenches.

The above semiconductor device fabrication method may also comprise:

forming electrical interconnection bumps on ends of at least some of the electrically conductive members exposed on at least one of the upper surface and the lower surface; and forming thermal conduction bumps on ends of at least some of the thermally conductive members exposed on at least one of the upper surface and the lower surface.

DETAILED DESCRIPTION OF THE INVENTION

Figure 1:
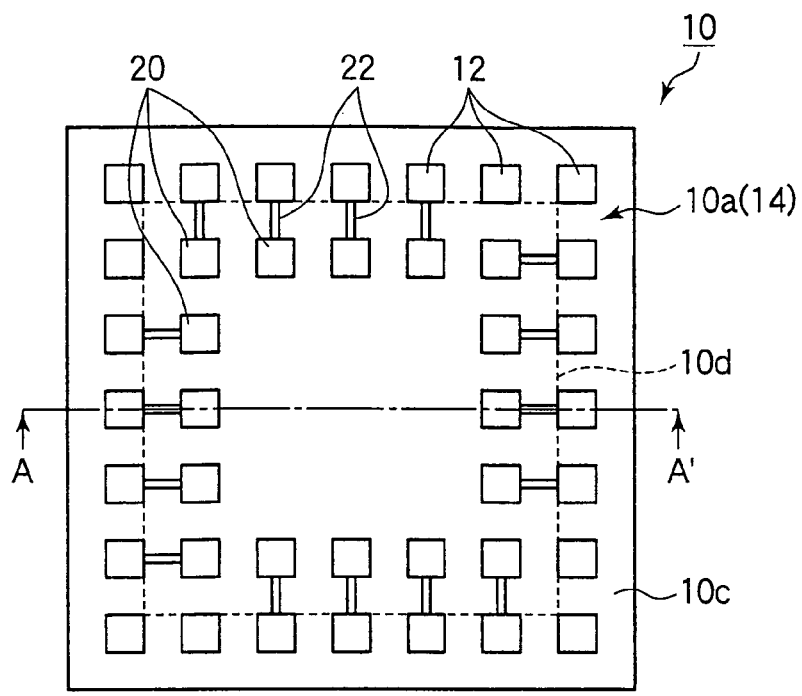
FIG. 1 is a schematic plan view of a semiconductor device according to a first embodiment of the invention.

Embodiments of the invention will now be described with reference to the attached drawings, in which like elements are indicated by like reference characters.

First Embodiment

Figure 2:
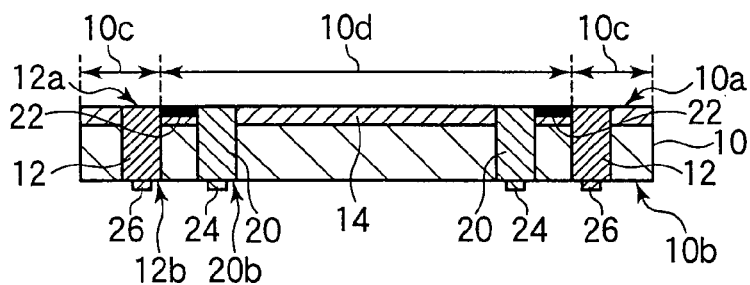
FIG. 2 is a sectional view through line AA' in FIG. 1.
Figure 3:
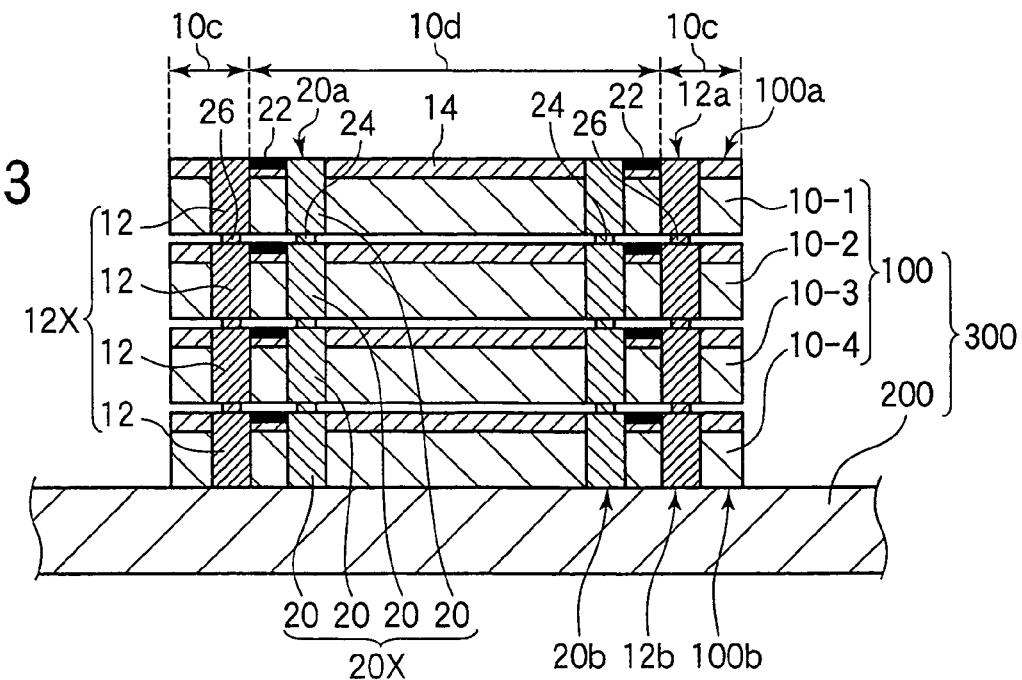
FIG. 3 is a sectional view of semiconductor devices as shown in FIG. 2 stacked to form a multichip package mounted on a substrate.

In the first embodiment, semiconductor devices of the type shown in FIGS. 1 and 2 are stacked as shown in FIG. 3. Each semiconductor device 10 has a silicon substrate covered by a dielectric protective film 14. The first major surface 10a of the device 10 is the outer surface of the dielectric protective film 14; the second major surface 10b of the device 10 is the undersurface of the silicon substrate.

Seen from the first and second major surfaces 10a and 10b, the semiconductor device 10 is rectangular in shape. The semiconductor device 10 accordingly has the form of a rectangular solid, although the first embodiment is not limited to this particular form.

The semiconductor device 10 has a plurality of electrically conductive members referred to below as electrical vias 12 that function as paths for input and output signals, or as power and ground paths, for microelectronic circuits formed below the dielectric protective film 14. The electrical vias 12 are disposed in the outer area 10c of the semiconductor device 10 around the edges of the first and second major surfaces 10a and 10b. In this embodiment there are a total of twenty-four electrical vias 12 arrayed to form a straight row of seven at each of the four edges.

Each electrical via 12 penetrates from the first major surface 10a to the second major surface 10b of the device. The end of the electrical via 12 exposed at the first major surface 10a will be referred to as the first end 12a; the other end of the electrical via 12, exposed at the second major surface 10b, will be referred to as the second end 12b. The electrical via 12 functions as a terminal and is electrically connected to one or more circuit elements in the semiconductor device 10 through, for example, a multilayer interconnection structure (not shown) disposed between the silicon substrate and the dielectric protective film 14. Signals output from or input to the semiconductor device 10 can be routed in both directions between the first and second major surfaces 10a and 10b through the electrical vias 12.

The semiconductor device 10 also has a plurality of thermally conductive members, referred to below as thermal vias 20, that conduct heat. The thermal vias 20 are disposed in an inner area 10d, paralleling the edges of the first and second major surfaces 10a and 10b but inward of the array of electrical vias 12. In this embodiment, there are a total of sixteen thermal vias 20, arrayed to form a straight row of five paralleling each of the four edges. Each thermal via 20 penetrates from the first major surface 10a to the second major surface 10b. The end of the thermal via 20 exposed at the first major surface 10a will be referred to as the first end 20a; the other end of the thermal via 20 exposed at the second major surface 10b will be referred to as the second end 20b.

Any number of thermal vias 20 can be spaced at any intervals in any formation as long as the object of the present invention is achieved. In a stacked package the semiconductor device 10 has a particular tendency to overheat in its central regions, so the thermal vias 20 are disposed in the inner area 10d, where they can conduct heat generated in the central regions away from the semiconductor devices 10. In the present embodiment, the plurality of thermal vias 20 and the plurality of electrical vias 12 are both disposed at equal regular intervals.

The electrical vias 12 and thermal vias 20 are preferably interconnected by thermally conductive wires 22. In the present embodiment the connections are one-to-one: each thermally conductive wire 22 connects a thermal via 20 to the nearest electrical via 12. In general, the thermally conductive wires 22 may connect either one or a plurality of thermal vias 20 to one electrical via 12. The thermally conductive wire 22 does not need to provide electrical continuity and can be made of any material of high thermal conductivity.

It is, however, preferable that the electrical vias 12, thermal vias 20, and thermally conductive wires 22 be made of the same material, such as copper or a copper alloy, so that they can be formed in the same step in the fabrication process.

If the electrical vias 12, thermal vias 20, and thermally conductive wires 22 are made of different materials, the thermal vias 20 and thermally conductive wires 22, which are provided to improve the heat dissipation properties of the semiconductor device 10, should be made of a material having a higher thermal conductivity and better heat dissipation performance than the material of the electrical vias 12.

In FIG. 3, a plurality of semiconductor devices 10-1, 10-2, 10-3, 10-4 (referred to generically below as semiconductor devices 10) having the same shape are stacked to form a package. The semiconductor devices 10 are electrically interconnected by connecting the electrical vias 12 exposed at the first major surfaces 10a and second major surfaces 10b with electrical interconnection bumps 26. The electrical interconnection bumps 26 may be disposed on either or both of the first ends 12a and second ends 12b of the electrical vias 12. When the semiconductor devices 10 are stacked, pairs of electrical vias 12 are interconnected by the electrical interconnection bump or bumps 26 present between the first end 12a of one electrical via and the second end 12b of another electrical via. The electrical interconnection bumps 26 may be conventional solder bumps.

The semiconductor device 10 also has thermal conduction bumps 24. The thermal conduction bumps 24 are disposed on either or both of the first ends 20a and second ends 20b of the thermal vias 20 exposed at the first major surfaces 10a and second major surfaces 10b of the semiconductor devices. When the semiconductor devices 10 are stacked, pairs of thermal vias 20 are interconnected by the thermal conduction bump or bumps 24 present between the first end 20a of one thermal via and the second end 20b of another thermal via. The thermal conduction bumps 24 may also be conventional solder bumps, but the thermal conduction bumps 24 need not be electrically conductive and may be made of any thermally conductive material.

The stacked structure will now be described in more detail.

The stacked structure 100 in FIG. 3 comprises a stack of four semiconductor devices 10-1, 10-2, 10-3, 10-4 all having the configuration shown in FIGS. 1 and 2, except that the bottom semiconductor device 10-4 lacks thermal conduction bumps 24 and electrical connection bumps 26.

The semiconductor devices 10 are stacked in such a way that the first major surface 10a of one semiconductor device 10 faces the second major surface 10b of another semiconductor device 10. For instance, semiconductor device 10-1 is stacked on semiconductor device 10-2 with the second major surface 10b of semiconductor device 10-1 facing the first major surface 10a of semiconductor device 10-2. The other semiconductor devices 10 are stacked in the same manner. The first major surface 10a of semiconductor device 10-1 becomes the top surface 100a of the stacked structure 100, and the second major surface 10b of semiconductor device 10-4 becomes the bottom surface 100b of the stacked structure 100.

A series of thermal vias 20 connected by thermal conduction bumps 24 forms what will be referred to as a thermally conductive column 20X. Similarly, a series of electrical vias 12 interconnected by one or more electrical interconnection bumps 26 forms what will be referred to as an electrically conductive column 12X. It is not necessary for a conductive column 12X or 20X to extend from the top surface 10a to the bottom surface 100b of the stacked structure 100 as shown in FIG. 3; a column 12X or 20X may consist of a single pair of vias 12 or 20 interconnected by a single bump 26 or 24, for example. It is preferable, however, for at least one thermally conductive column 20X to extend from the top surface 10a to the bottom surface 100b of the stacked structure 100.

With this configuration, heat generated by the semiconductor devices 10 in the stacked structure 100 is conducted to its top surface 100a or bottom surface 100b, from which the heat is dissipated efficiently to the ambient environment. Heat does not build up in the central regions of the stack, and the individual semiconductor devices 10 and the stacked structure 100 can be kept at a low temperature.

The thermally conductive wires 22 conduct heat from electrical vias 12 to the thermal vias 20 and vice versa, enabling the vias 12, 20 to be used with maximum efficiency to conduct heat from within the stacked structure 100 to the ambient environment. The thermal vias 20 and thermally conductive wires 22 thus cooperate to improve the reliability of the multichip package by protecting its constituent semiconductor devices from thermal distortion, damage, and destruction.

The stacked structure 100 shown in FIG. 3 is mounted on a mounting substrate 200 to form a mounted structure 300. The mounting substrate 200 may be a conventional printed wiring board. The bottom surface 100b of the stacked structure 100 and the second ends 12b and 20b of the electrical and thermal vias 12 and 20 in the lowermost semiconductor device 10-4, which are exposed on the bottom surface 100b, are in contact with the top surface of the mounting substrate 200.

Although not shown in FIG. 3, thermal conduction bumps 24 or electrical interconnection bumps 26, or both, may be present between the bottom surface 100b of the stacked structure 100 and the mounting substrate 200, to assure good thermal conductivity between the electrical vias 12 and/or thermal vias 20 and the mounting substrate 200. In this configuration, heat generated in semiconductor device 10-4 is conducted from its upper surface, where the heat generation takes place, through the electrical vias 12 and/or thermal vias 20 to the mounting substrate. If the electrical vias 12 and thermal vias 20 are made of a material such as copper that conducts heat much better than the silicon body of semiconductor device 10-4, this thermal conduction path will be more efficient than the path leading directly downward from the upper surface of semiconductor device 10-4 through the body of semiconductor device 10-4 to the mounting substrate 200, so that the improved contact between the electrical vias 12 and/or thermal vias 20 and the mounting substrate 200 more than compensates for any loss in direct thermal conductivity between the body of semiconductor device 10-4 and the mounting substrate 200. Whether to provide bumps between the bottom semiconductor device 10-4 in the stack 100 and the mounting substrate 200 is a design choice; whichever scheme keeps the stacked structure 100 at a lower temperature should be used.

Next, a method of fabricating semiconductor devices 10 according to the present invention from a semiconductor wafer will be described with reference to FIGS. 4 to 10. The wafer is divided into a plurality of chip areas, each of which will become a separate semiconductor device. All chip areas are processed simultaneously. The drawings show cross-sectional views of one chip area.

Figure 4:
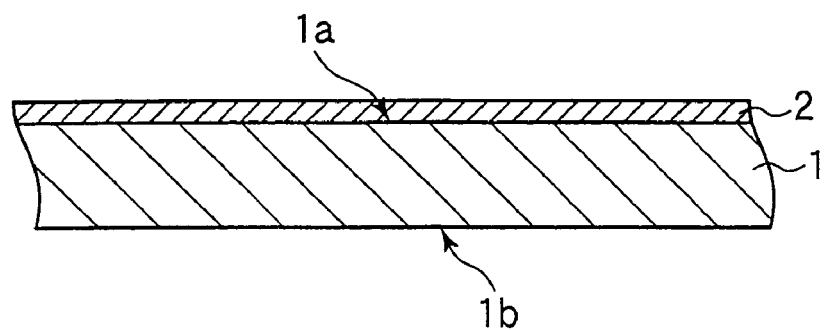
FIGS. 4, 5, 6, 7, 8, 9, and 10 are sectional views illustrating steps in the fabrication of the semiconductor device shown in FIGS. 1 and 2.

Referring to FIG. 4, the semiconductor wafer 1 has an upper surface 1a and a lower surface 1b. Microelectronic circuits, including doped semiconductor regions and a multilayer interconnecting structure comprising patterned layers of aluminum or another electrically conductive material separated by insulating layers, are formed in and on the upper surface 1a, which is then covered by a dielectric film 2 that will become part of the dielectric protective film 14 shown in FIG. 2.

Figure 5:
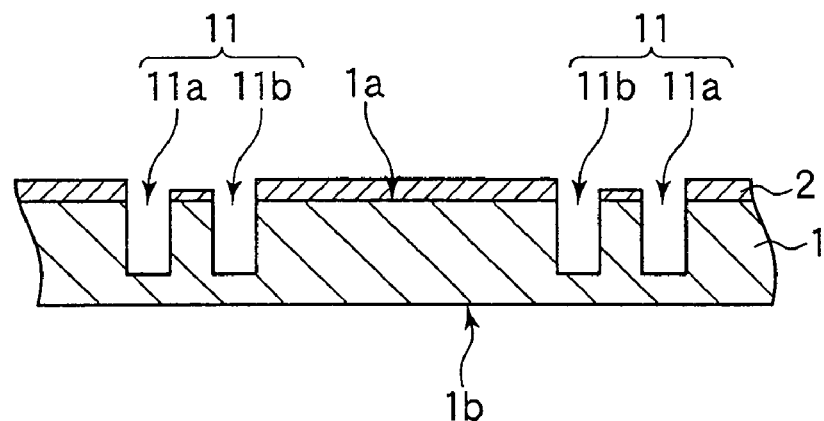

A plurality of holes 11, including electrical interconnection holes 11a and heat dissipation holes 11b, are formed in the semiconductor wafer 1 by conventional techniques such as photolithography and etching, as shown in FIG. 5. The holes 11 do not penetrate completely through the semiconductor wafer 1. The holes 11 are arranged in a pattern that provides high heat dissipation performance without affecting the functions of the microelectronic circuits. In particular, the heat dissipation holes 11b are located inward of the array of electrical interconnection holes 11a. To prevent short circuits, a superficial dielectric film of silicon dioxide ($SiO_2$) or the like not shown) is formed on the interior surfaces of the holes 11.

Figure 6:
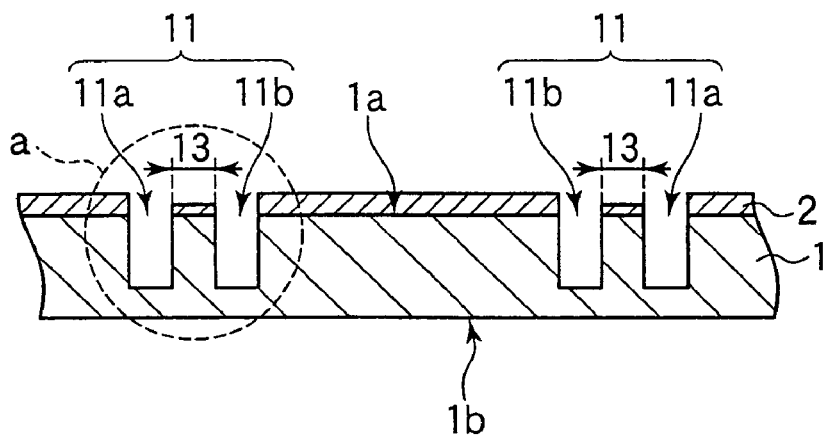

Referring to FIG. 6, trenches 13 are formed by conventional techniques such as photolithography and etching, to connect the electrical interconnection holes 11a and heat dissipation holes 11b. The depth and width of the trenches 13 are less than the depth and width of the holes 11, but the trenches are deep and wide enough for efficient conduction of heat between the electrical and thermal vias.

Figure 7:
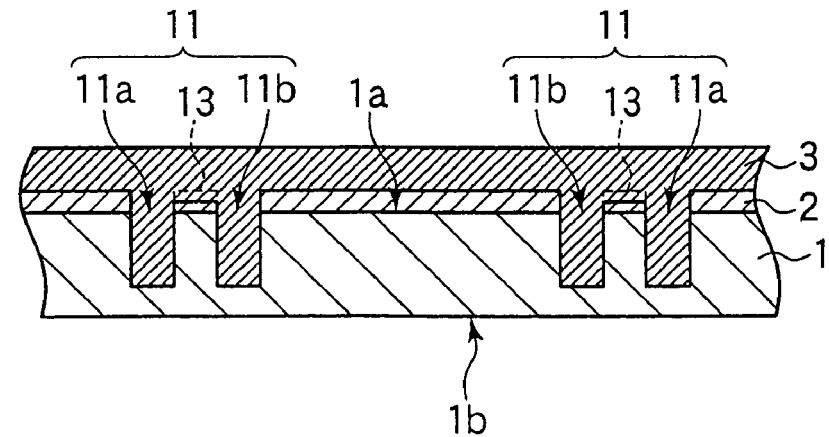

Referring to FIG. 7, a metal film 3 is formed on the dielectric film 2 by a conventional technique such as chemical vapor deposition (CVD) or sputtering, filling the holes 11 and trenches 13. The metal film is preferably a copper film. It is preferable that the electrical interconnection holes 11a, heat dissipation holes 11b, and trenches 13 be filled by the same material in the same step.

The material filling the heat dissipation holes 11b and trenches 13, however, need not be electrically conductive, so it is possible to fill the electrical interconnection holes 11a with an electrically conductive material such as copper and fill the heat dissipation holes 11b and trenches 13 with another material, possibly a ceramic material, having high thermal conductivity and heat dissipation performance.

Figure 8:
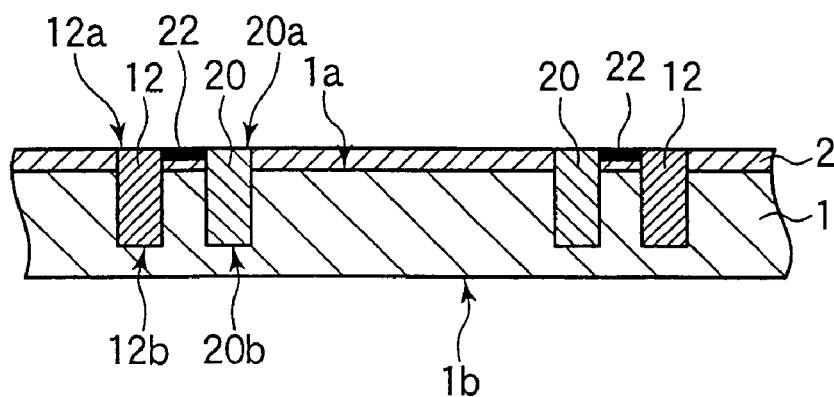
Figure 9:
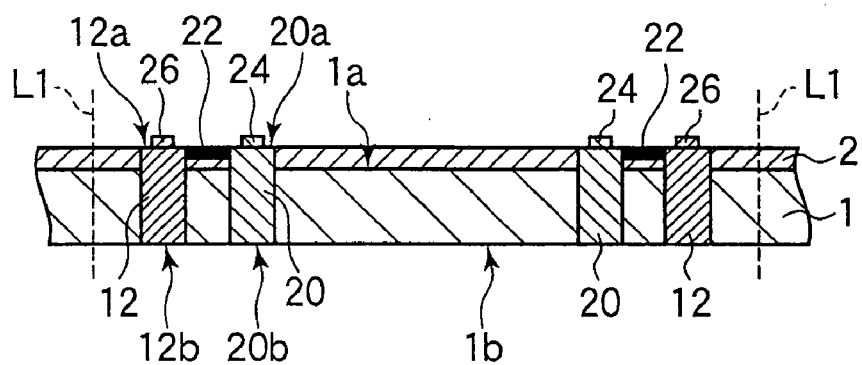

The metal or other film 3 deposited in FIG. 7 is now removed down to the level of the dielectric film 2, as shown in FIG. 8, leaving electrical vias 12 filling the electrical interconnection holes 11a, thermal vias 20 filling the heat dissipation holes 11b, and thermally conductive wires 22 filling the trenches 13. The exposed ends of the electrical vias 12 and thermal vias 20 are their first ends 12a, 20a. The lower surface 1b of the wafer 1 is also removed, by grinding, for example, until the second ends 12b, 20b of the electrical vias 12 and thermal vias 20 are exposed, as shown in FIG. 9.

Figure 10:
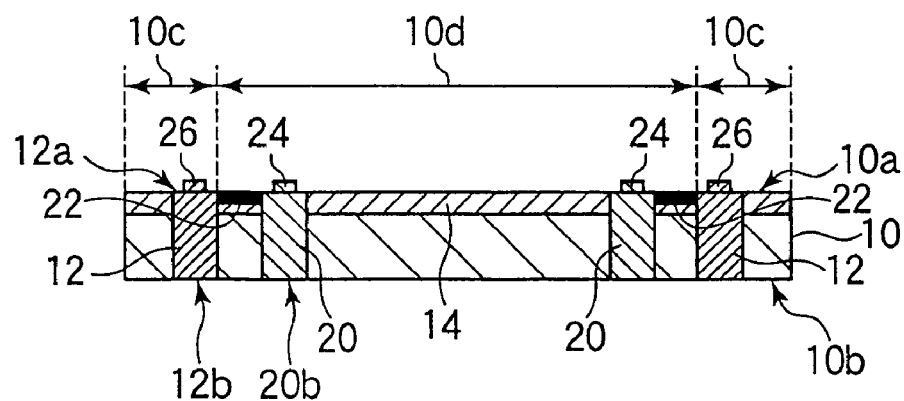

Referring to FIG. 10, thermal conduction bumps 24 and electrical interconnection bumps 26 are formed on some or all of the exposed first ends 12a and 20a. The bumps are made of a material such as solder or gold (Au), and may be formed by a plating or evaporation process, for example. The semiconductor wafer 1 is then diced along lines L1 to separate the chip areas from each other and form a plurality of semiconductor devices 10 as shown in FIG. 10.

A variation of this fabrication process in which more elaborate thermally conductive wires 22 are formed will now be described in more detail with reference to FIGS. 11 to 18. In this variation, the thermally conductive wires 22 function partly as electrically conductive wires connecting the electrical vias 12 to the multilayer interconnection structure mentioned above. The steps that form the electrical vias 12, thermal vias 20, and thermally conductive wires 22 may accordingly be carried out as part of the process that forms the multilayer interconnection structure.

The initial steps in this process, through the formation of holes 11, are carried out as described above and illustrated in FIGS. 4 and 5.

Figure 11:
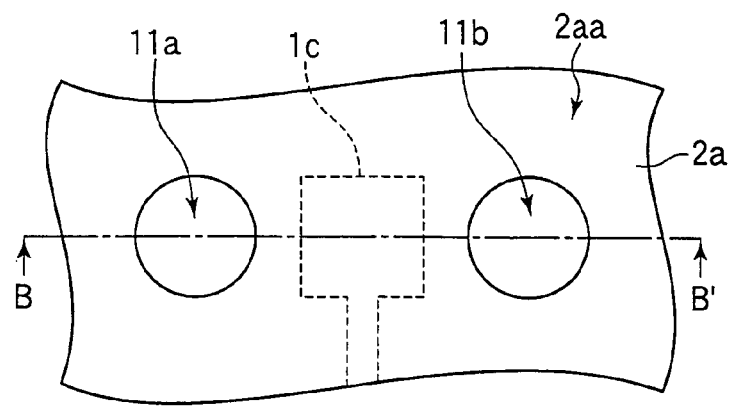
FIG. 11 is an enlarged plan view of area 'a' in FIG. 5, illustrating a buried electrode pad.
Figure 12:
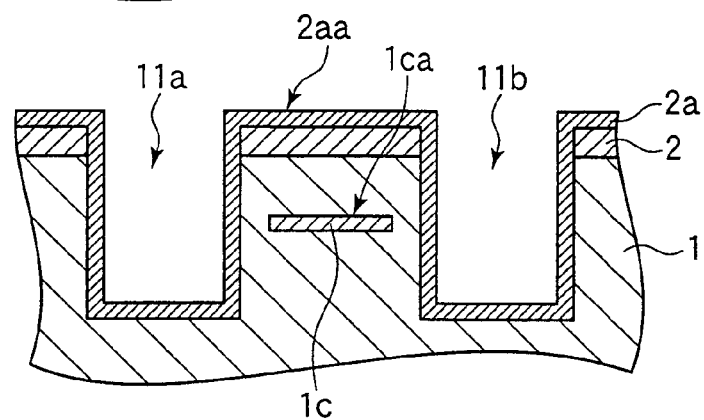
FIG. 12 is a sectional view through line BB' in FIG. 11.

FIGS. 11 and 12 show the wafer at the stage at which the electrical interconnection holes 11a and heat dissipation holes 11b have been created, but before the trenches 13 have been formed. One part of the multilayer interconnection structure is an electrode pad 1c disposed between the electrical interconnection hole 11a and heat dissipation hole 11b in FIG. 11. The electrode pad 1c has a lead by which it is connected to a microelectronic circuit element (not shown). The electrode pad 1c is buried at some depth below the dielectric film 2, as shown in FIG. 12, and is not yet exposed.

At this stage, the interior surfaces of the holes 11 and the surface of the dielectric film 2 are covered by a superficial dielectric film 2a, mentioned above but not shown in FIG. 5, which will also become part of the dielectric protective film 14 in FIG. 2.

Figure 13:
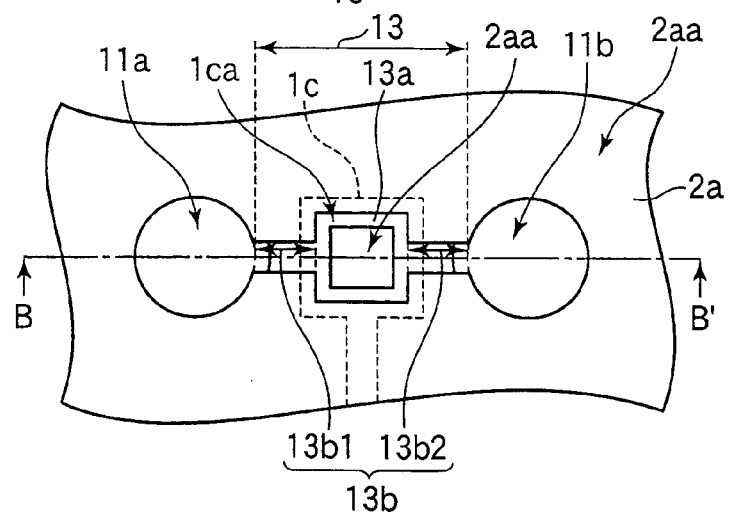
FIG. 13 is another enlarged plan view, illustrating the formation of an elaborated trench encircling the buried electrode.
Figure 14:
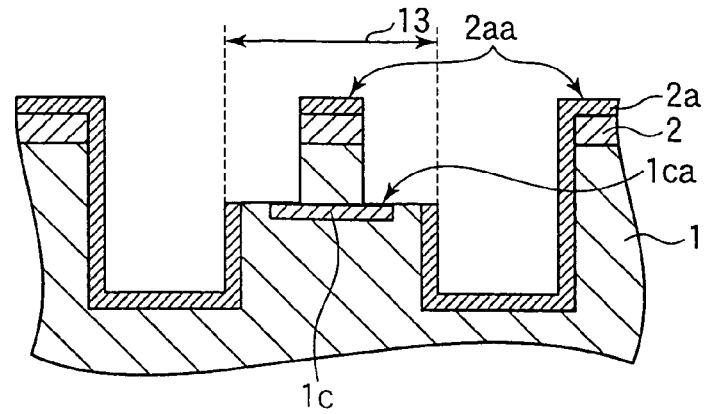
FIG. 14 is a sectional view through line BB' in FIG. 13.

The trench 13 that interconnects the electrical interconnection hole 11a and heat dissipation hole 11b in FIGS. 11 and 12 is formed by photolithography and etching as shown in FIGS. 13 and 14. The electrode pad 1c is partly exposed in this step. The exposed part of the electrode pad 1c is annular; the part of the trench 13 disposed above it is referred to as an encircling trench 13a, since it encircles an island of wafer material, including part of the dielectric films 2 and 2a. The top surface of this island is the surface 2aa of the superficial dielectric film 2a. A first trench segment 13b1 extends linearly from the electrical interconnection hole 11a to the encircling trench 13a; a second trench segment 13b2 extends linearly from the heat dissipation hole 11b to the encircling trench 13a. The trench 13 comprises the encircling trench 13a and a discontinuous linear trench 13b including both trench segments 13b1 and 13b2.

In the example shown, the depth of the trench 13 is the depth at which the upper surface 1ca of the electrode pad 1c is exposed.

Figure 15:
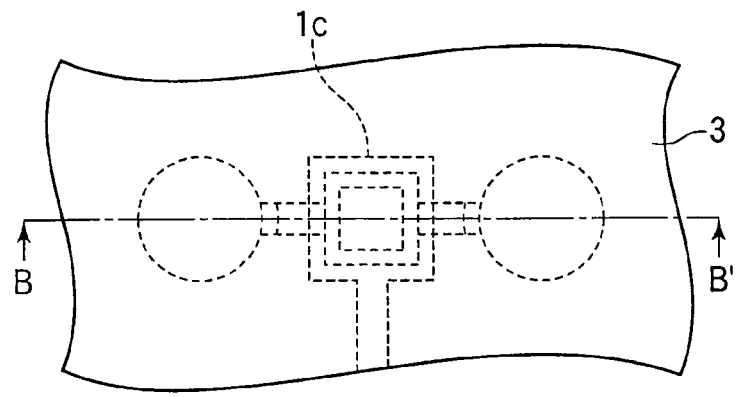
FIG. 15 is an enlarged plan view illustrating a first step in the formation of a conductive wire in the elaborated trench.
Figure 16:
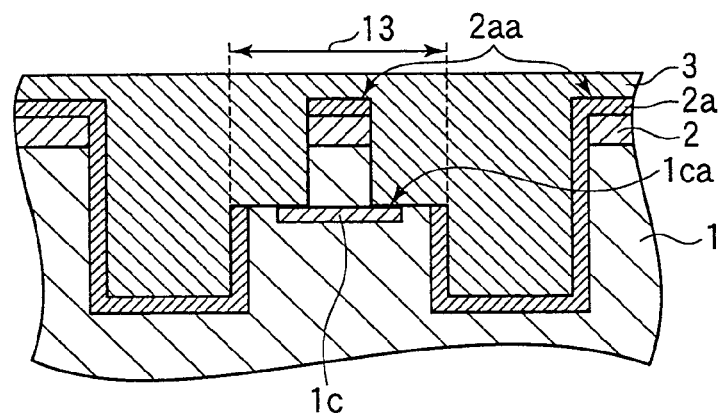
FIG. 16 is a sectional view through line BB' in FIG. 15.

Referring to FIGS. 15 and 16, a metal film 3 is deposited on the wafer surface, covering the superficial dielectric film 2a and filling the electrical interconnection hole 11a, heat dissipation hole 11b, and trench 13. The metal film is preferably a copper film.

Figure 17:
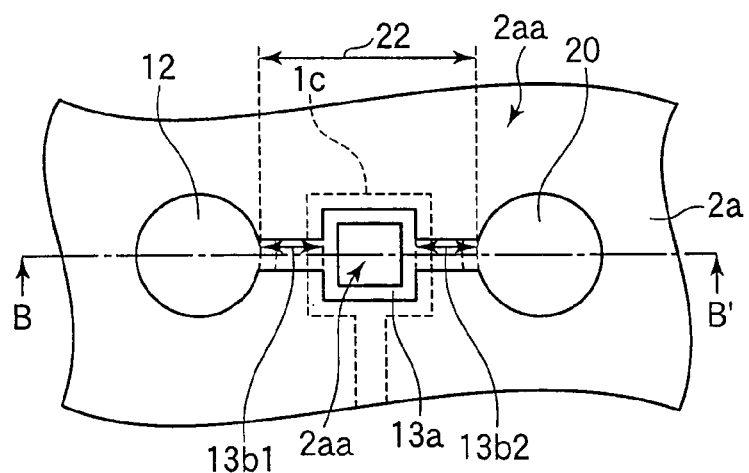
FIG. 17 is an enlarged plan view illustrating a second step in the formation of the conductive wire.
Figure 18:
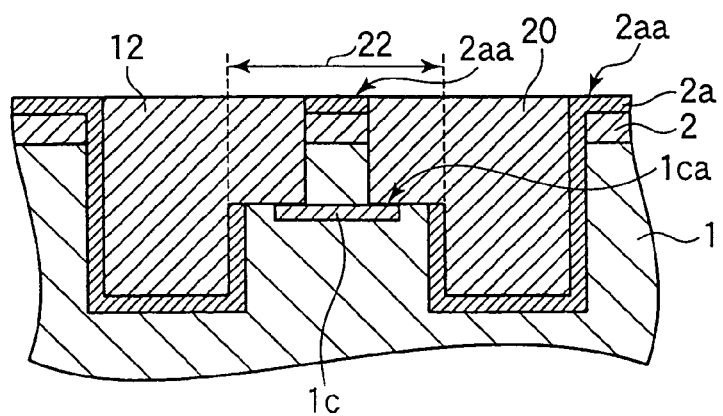
FIG. 18 is a sectional view through line BB' in FIG. 17.

The metal film 3 is then removed from the upper surface of the semiconductor wafer 1 until the surface 2aa of the superficial dielectric film 2a is exposed, as shown in FIGS. 17 and 18. Also exposed are an electrical via 12 filling the electrical interconnection hole 11a, a thermal via 20 filling the heat dissipation hole 11b, and a thermally conductive wire 22 filling the trench 13.

The thermally conductive wire 22 electrically connects the electrical via 12, thermal via 20, and electrode pad 1c. The part of the thermally conductive wire 22 filling the encircling trench 13a and first trench segment 13b1 is an electrically and thermally conductive member that electrically interconnects the electrical via 12 and electrode pad 1c and thermally interconnects the electrical via 12 and the encircling trench 13a. The part of the thermally conductive wire 22 filling the second trench segment 13b2 thermally interconnects the encircling trench 13a and the thermal via 20. The thermal via 20 and this part of the thermally conductive wire 22 are also electrically conductive in this embodiment, although that is not a necessary condition in general.

In this elaboration of the first embodiment, the thermally conductive wire 22, which is formed in a single step together with the electrical vias 12 and thermal vias 20, provides both electrical conductivity between an electrical via 12 and the microelectronic circuit and thermal conductivity between the electrical via 12 and a thermal via 20, thereby simplifying the fabrication of the semiconductor device 10.

Second Embodiment

Figure 19:
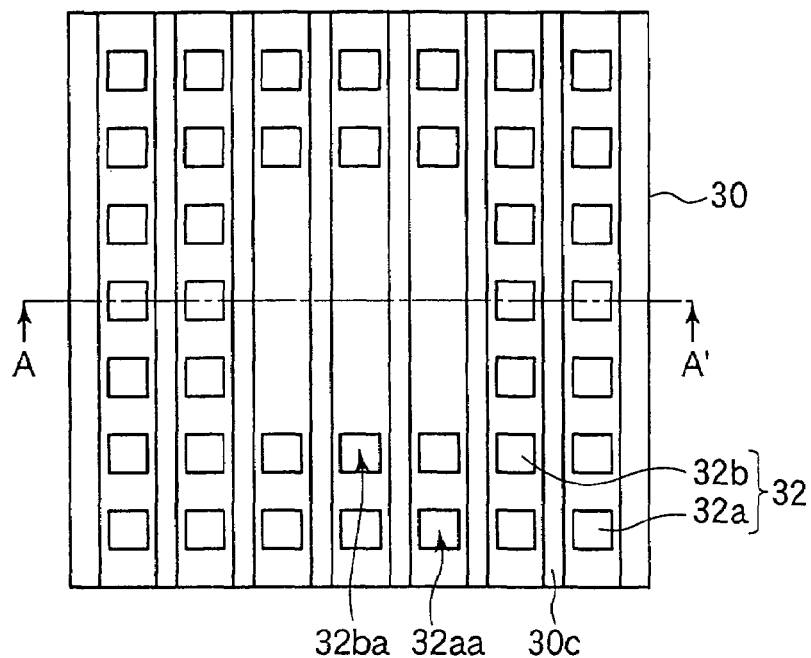
FIG. 19 is a schematic plan view of a stacked structure according to a second embodiment of the invention.

A second embodiment of the present invention will be described with reference to FIGS. 19 and 20. The second embodiment adds a heat dissipator to the stacked and mounted structures described in the first embodiment. The heat dissipator is located on the top surface of the stacked structure to provide improved dissipation of heat generated by the semiconductor devices 10 to the ambient environment.

Figure 20:
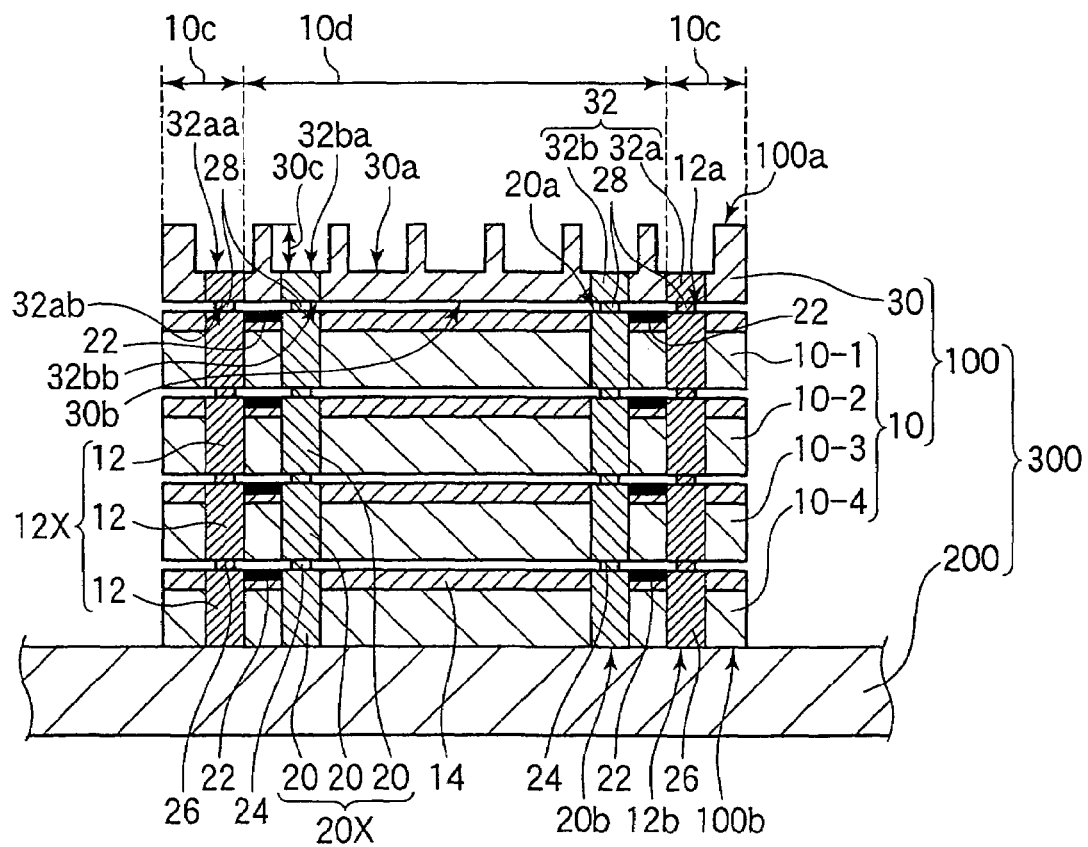
FIG. 20 is a sectional view through line AA' in FIG. 19, showing the stacked structure mounted on a substrate.

The heat dissipator 30 in the second embodiment is a silicon heat sink having an upper surface 30a and a lower surface 30b, with fins 30c extending from the upper surface 30a as shown in FIG. 20. The heat dissipator 30 rests atop the uppermost semiconductor device 10-1 in the stacked structure 100, so the top surface 100a of the stacked structure 100 is now the upper surface of the fins 30c. The lower surface 30b of the heat dissipator 30 is connected by thermal conduction bumps 28 to the electrically conductive columns 12X and thermally conductive columns 20X. Heat generated in the semiconductor devices 10 is conducted to the heat dissipator 30 by these columns 12X, 20X and dissipated efficiently from the fins 30c to the ambient atmosphere. The semiconductor devices 10 in the stacked structure 100 can thus be cooled more efficiently than in the first embodiment.

The heat dissipator 30 has thermal vias 32 penetrating from its upper surface 30a to its lower surface 30b. In the example shown, the thermal vias 32 include first thermal vias 32a connected to the electrically conductive columns 12X exposed in the stacked structure 100 and second thermal vias 32b connected to the thermally conductive columns 20X. Each first thermal via 32a has an upper end 32aa exposed on the upper surface 30a and a lower end 32ab exposed on the lower surface 30b of the heat dissipator 30. Similarly, each second thermal via 32b has an upper end 32ba exposed on the upper surface 30a and a lower end 32bb exposed on the lower surface 30b of the heat dissipator 30.

Heat is conducted from the electrically conductive columns 12X to the first thermal vias 32a and from the thermally conductive columns 20X to the second thermal vias 32b through the thermally conductive bumps 28, which may be provided on the bottom ends 32ab, 32bb of all of the first thermal vias 32a and second thermal vias 32b, or of a subset selected to provide adequate heat dissipation. Alternatively, the thermally conductive bumps 28 may be omitted and the lower ends 32ab, 32bb of the thermal vias 32a, 32b may rest directly on the upper ends of the conductive columns 12X, 20X; whichever scheme provides better thermal conductivity may be selected.

The fins 30c increase the surface area of the heat dissipator 30, thereby enhancing its heat dissipation performance. The fins 30c shown in FIGS. 19 and 20 are flat upright parallel strips, arranged so that the first thermal vias 32a and second thermal vias 32b are disposed between the fins 30c, but the heat dissipator 30 is not limited to this arrangement. The fins 30c may have any size, shape, placement, and spacing that achieves the object of the invention. The number of fins 30c is not limited to the eight shown: there may be more or fewer than eight fins, including the extreme case of no fins at all.

Third Embodiment

Figure 21:
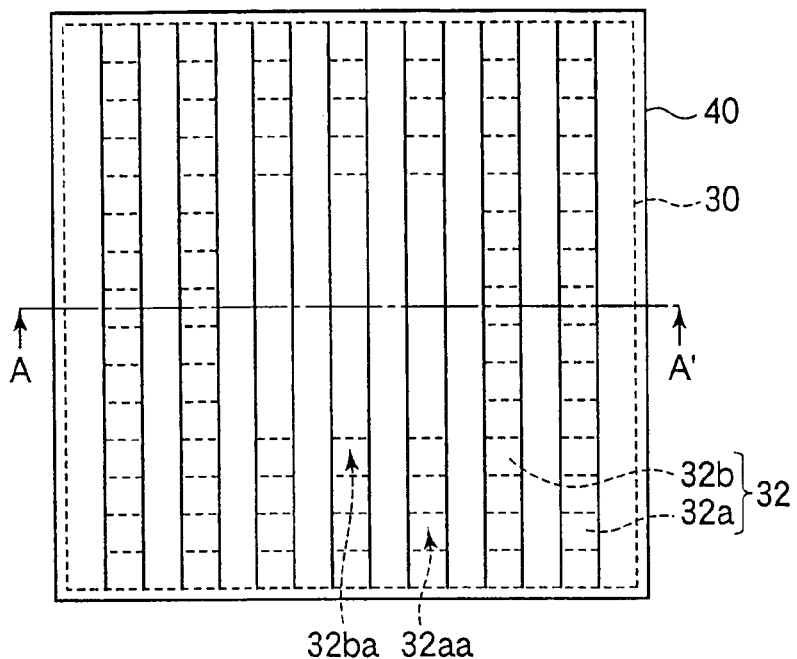
FIG. 21 is a schematic plan view of a stacked structure according to a third embodiment of the invention.
Figure 22:
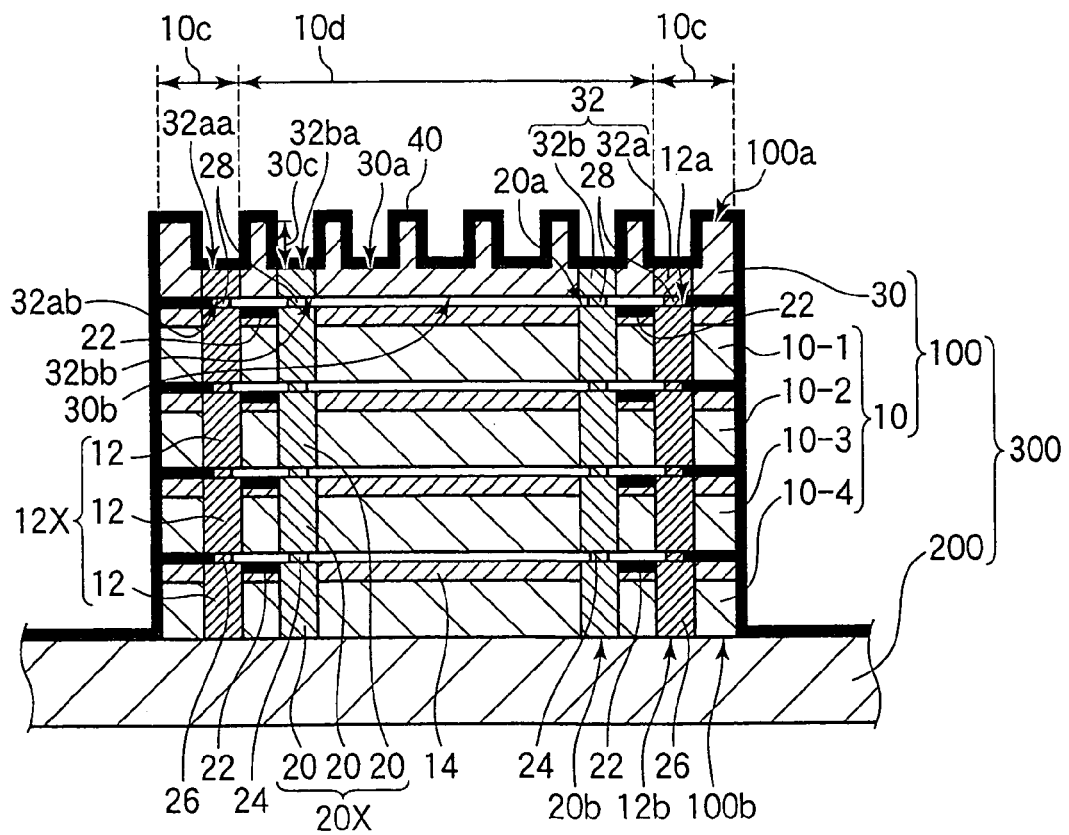
FIG. 22 is a sectional view through line AA' in FIG. 21, showing the stacked structure mounted on a substrate.

The third embodiment of the present invention adds a heat dissipating coating to the stacked and mounted structures of the second embodiment. Referring to FIGS. 21 and 22, the coating 40 covers all exposed surfaces of the mounted structure 300, including the upper surface 30a of the heat dissipator 30, the upper and side surfaces of the fins 30c, the sides of the individual semiconductor devices 10, and the surface of the mounting substrate 200.

The coating 40 comprises a material that promotes dissipation of heat generated by the mounted stacked structure, such as a known liquid ceramic paint that promotes thermal radiation and has a heat dissipation ratio of about 0.92.

The coating 40 is formed by spraying liquid ceramic paint, for example, onto the exposed areas of the mounted structure 300 after the semiconductor devices 10 are stacked and the stacked structure 100 is mounted on the mounting substrate 200.

The coating 40 can enhance the heat dissipation performance of the heat dissipator 30 and the exposed surfaces of the semiconductor devices 10 and the mounting substrate 200 by enhancing their ability to radiate heat.

The present invention is not limited to the embodiments described above. Those skilled in the art will recognize that further variations are possible within the scope of the invention, which is defined in the appended claims.

What is claimed is:

1. A semiconductor device comprising:
   a semiconductor substrate having edges, a first major surface, and a second major surface, the first major surface having microelectronic circuits and first trenches thereon;
   a plurality of electrically conductive members penetrating through the semiconductor substrate from the first major surface to the second major surface, disposed in an array around edges of the first major surface and the second major surface;
   a plurality of thermally conductive members penetrating through the semiconductor substrate from the first major surface to the second major surface; and
   a plurality of thermally conductive wires in the first trenches and connecting the thermally conductive members to the electrically conductive members.

2. The semiconductor device of claim 1, wherein on each major surface of the semiconductor device, the plurality of thermally conductive members are disposed in an inner area, inward of the array of electrically conductive members.

3. The semiconductor device of claim 2, wherein the thermally conductive members form an array aligned with the array of electrically conductive members.

4. The semiconductor device of claim 1, wherein the thermally conductive wires connect each of the thermally conductive members to respectively different ones of the electrically conductive members, so that none of the electrically conductive members are connected to more than one of the thermally conductive members.

5. The semiconductor device of claim 1, wherein the electrically conductive members and the thermally conductive members are copper or a copper alloy.

6. The semiconductor device of claim 1, further comprising:
   a plurality of electrical interconnection bumps on exposed surfaces of the electrically conductive members on one or both of the two major surfaces; and
   a plurality of thermally conductive bumps on exposed surfaces of the thermally conductive members on one or both of the two major surfaces.

7. A stacked structure including a plurality of semiconductor devices, each of the semiconductor devices comprising:
   a semiconductor substrate having edges, a first major surface, and a second major surface, the first major surface having microelectronic circuits and first trenches thereon;
   a plurality of electrically conductive members penetrating through the semiconductor substrate from the first major surface to the second major surface, disposed in an array around edges of the first major surface and the second major surface;
   a plurality of thermally conductive members penetrating through the semiconductor substrate from the first major surface to the second major surface; and
   a plurality of thermally conductive wires in the first trenches and connecting the thermally conductive members to the electrically conductive members,
   the semiconductor devices being stacked so that at least some of the thermally conductive members, disposed in different ones of the semiconductor devices, are mutually connected to form thermally conductive columns, at least one of the thermally conductive columns extending through all of the semiconductor devices constituting the stacked structure.

8. The stacked structure of claim 7, wherein the thermally conductive columns are disposed in an inner area, inward of the array of electrically conductive members in each semiconductor device.

9. The stacked structure of claim 8, wherein the thermally conductive columns form an array aligned with the array of electrically conductive members in each semiconductor device.

10. The stacked structure of claim 7, wherein in the at least one of the semiconductor devices, the thermally conductive wires conned each of the thermally conductive members to respectively different ones of the electrically conductive members, so that none of the electrically conductive members are connected to more than one of the thermally conductive members.

11. The stacked structure of any of claim 7, further comprising a plurality of thermal conduction bumps for interconnecting the thermally conductive members in different ones of the semiconductor devices.

12. The stacked structure of claim 7, wherein at least some of the electrically conductive members, disposed in different ones of the semiconductor devices, are mutually connected to form electrically conductive columns.

13. The stacked structure of claim 12, further comprising a plurality of electrical interconnection bumps for interconnecting said at least some of the electrically conductive members.

14. The stacked structure of claim 7, further comprising a heat dissipator having an upper surface and a lower surface, the lower surface being connected to an uppermost one of the semiconductor devices constituting the stacked structure.

15. The stacked structure of claim 14, wherein the heat dissipator has a plurality of thermally conductive members penetrating from the upper surface to the lower surface and connecting with at least some of the thermally conductive members and/or electrically conductive members in the uppermost one of the semiconductor devices.

16. The stacked structure of claim 14, wherein the heat dissipator further comprises at least one fin projecting from the upper surface.

17. The stacked structure of claim 7, further comprising a liquid ceramic coating covering all exposed surfaces of the stacked structure, the liquid ceramic coating promoting heat dissipation.

18. A mounted structure comprising the stacked structure of claim 7 and a mounting substrate, the stacked structure being mounted on the mounting substrate, at least some of the electrically conductive members and/or the thermally conductive members in a lowermost one of the semiconductor devices constituting the stacked structure being connected to a surface of the mounting substrate.

19. A semiconductor device comprising:
   a semiconductor substrate having edges, a first major surface, and a second major surface, the first major surface having microelectronic circuits thereon;
   a plurality of electrically conductive members penetrating through the semiconductor substrate from the first major surface to the second major surface, disposed in an array around edges of the first major surface and the second major surface;
   a plurality of thermally conductive members penetrating through the semiconductor substrate from the first major surface to the second major surface;
   trenches in the first major surface between the electrically conductive members and the thermally conductive members,
   each of the trenches having an electrode pad at a bottom thereof, with an insulative column on the electrode pad that exposes peripheral portions of the electrode pad; and
   a plurality of thermally conductive wires in the trenches, the thermally conductive wires thermally connect the thermally conductive members and the electrically conductive members to the peripheral portions of the electrode pads.

20. The semiconductor device of claim 19, wherein the thermally conductive wires are electrically conductive between the electrically conductive members and the peripheral portions of the electrode pads, and are not electrically conductive between the thermally conductive members and the peripheral portions of the electrode pads.

21. The semiconductor device of claim 19, wherein the thermally conductive wires are electrically conductive between the electrically conductive members and the peripheral portions of the electrode pads, and between the thermally conductive members and the peripheral portions of the electrode pads.

* * * * *